United States Patent [19]
Czubatyj et al.

[11] Patent Number: 5,008,617
[45] Date of Patent: Apr. 16, 1991

[54] FUNCTIONAL TESTING OF ULTRA LARGE AREA, ULTRA LARGE SCALE INTEGRATED CIRCUITS

[75] Inventors: Wolodymyr Czubatyj, Warren; Ronald Himmler, Sterling Heights, both of Mich.

[73] Assignee: Energy Conversion Devices, Inc., Troy, Mich.

[21] Appl. No.: 369,784

[22] Filed: Jun. 20, 1989

[51] Int. Cl.⁵ .................. G01R 31/00; G01R 31/02
[52] U.S. Cl. .................. 324/158 R; 324/158 D; 324/158 T; 434/301; 437/8
[58] Field of Search .......... 324/158 R, 158 D, 158 T, 324/518, 214–216; 437/8; 434/301

[56] References Cited

U.S. PATENT DOCUMENTS

| | | | |
|---|---|---|---|
| 4,226,898 | 10/1980 | Ovshinsky et al. | 437/2 |
| 4,242,635 | 12/1980 | Burns | 324/158 R |
| 4,296,370 | 10/1981 | Comizzoli et al. | 324/158 R |
| 4,392,104 | 7/1983 | Lewis et al. | 324/518 |
| 4,485,389 | 11/1984 | Ovshinsky et al. | 357/15 |
| 4,660,995 | 4/1987 | Kraus | 277/228 |
| 4,667,189 | 5/1987 | den Boer et al. | 340/752 |
| 4,675,739 | 6/1987 | Catchpole et al. | 358/213.11 |
| 4,680,085 | 7/1987 | Vijan et al. | 156/652 |
| 4,698,627 | 10/1987 | den Boer et al. | 340/718 |
| 4,728,803 | 3/1988 | Catchpole et al. | 358/213.15 |

FOREIGN PATENT DOCUMENTS

| | | | |
|---|---|---|---|
| 2402124 | 8/1974 | Fed. Rep. of Germany | 324/518 |
| 0128774 | 10/1979 | Japan | 324/518 |

Primary Examiner—Ernest F. Karlsen
Assistant Examiner—William Burns
Attorney, Agent, or Firm—Marvin S. Siskind

[57] ABSTRACT

Disclosed is a method of testing ultra large area integrated circuits. The circuit has a plurality of individually addressable elements. The method comprises providing a dispersed chargeable powder with the integrated circuit in proximity to and above the powder. At least one device of the integrated circuit is electrically selected. An electrical potential is applied between the integrated circuit and the dispersed powder. The potential causes the chargeable particles to adhere to substantially only functional selected devices of the integrated circuit, thereby differentiating between functional and non-functional devices.

5 Claims, 4 Drawing Sheets

FUNCTIONAL TESTING OF ULTRA LARGE AREA, ULTRA LARGE SCALE INTEGRATED CIRCUITS

FIELD OF THE INVENTION

The present invention relates broadly to detecting manufacturing defects in ultra large area, ultra large scale integrated ("ULSI") circuits, as used, for example, in displays, sensors, and memories. The ULSI circuits are formed of semiconductor materials, most commonly non-crystalline semiconductor materials, e.g., amorphous, microcrystalline, or polycrystalline semiconductor materials. The materials may be formed by various deposition techniques or by various epitaxial growth techniques. The ULSI circuits may have one million or more individual non-linear devices, i.e., active devices, each having feature sizes on the order of microns. According to the invention an electric potential is applied between the ULSI circuit and a dispersion of chargeable fine particles. The electric potential causes the fine particles to be attracted to and adhere to the selected functional elements of the ULSI circuit. The invention provides a rapid, economical, real time quality control process.

BACKGROUND OF THE INVENTION

ULSI circuits include semiconductor memories as various kinds of RAMs and ROMs, optoelectronic devices as displays, e.g., active matrix liquid crystal displays, and sensors, as contact sensors and projected image sensors. These ULSI circuits can have as many as a million or more individual pixels, display cells, sensor cells, or memory cells, over an area of less than one tenth of a square meter, e.g., from about 0.6 square meter or more. Deposited or grown semiconductor ULSI's may contain 10 or more pixels, memory cells, or sensor cells per square millimeter. Each such individual cell has many resistors, diodes, and capacitors, and active devices, such as field effect transistors, and junction transistors. Thus, a ULSI may contain up to 40 million or more such individual devices, with each device having a feature size of as small as one micron.

These ultra large scale integrated circuits are fabricated by various methods including both epitaxial growth and deposition, by CVD and plasma processes. One typical method of fabricating these devices is the sequential deposition of amorphous semiconductor alloy layers to form, for example, large area diodes. These large area diodes may then be subsequently patterned, e.g., by lithographic processes, to form many individual diodes. Depositions may be accomplished by plasma assisted chemical vapor deposition, as disclosed, for example, in U.S. Pat. Nos. 4,226,898 and 4,485,389 to Stanford R. Ovshinsky and Masa Izu. As described by Ovshinsky and Izu, a plurality of semiconductor layers are successively deposited on a substrate, following which a top layer of metal is deposited. At least the top metal layer is then patterned using conventional photoresist mask and etching techniques, following which the semiconductor layer or layers may be likewise patterned, also using conventional photoresist mask and etching techniques.

An alternative method of fabricating thin film semiconductor ULSI circuits comprises depositing the semiconductor layers on a substrate, patterning the semiconductor layers with one large pattern, depositing the top layer of the metal, and then patterning the top metal layer with another pattern.

ULSI circuits can also be fabricated by sequentially combining several related techniques, e.g., deposition and/or epitaxial techniques in sequence with etching techniques. These techniques are especially useful in fabricating ULSI circuits with individual devices of semiconductor and semiconductor alloy materials, especially amorphous, microcrystalline, or polycrystalline semiconductor alloys of silicon or germanium. Examples of such individual devices include diodes, Schottky barrier diodes, non-linear threshold switches, field effect transistors, junction transistors, capacitors, and the like as well as linear devices as resistors.

These sequential steps have particular application to thin film semiconductor devices employing so called mesa structures, as found, for example in thin film large area distributed memories, displays, and sensors. "Mesa structure" refers to a structural or topographical feature of the device as characterized by one or more superimposed patterned semiconductor layers being elevated relative to the surrounding features of the device by the use of one or more steeply sloped or substantially vertical sidewalls. As described by Meera Vijan, John McGill, and Paul Day in U.S. Pat. No. 4,680,085 issued July 14, 1987, for *A Method of Manufacturing Thin Film Semiconductor Devices*, and specifically incorporated herein by reference, it is possible to fabricate large area, ULSI, active matrix liquid crystal displays having a plurality of diodes per pixel, e.g., two to four diodes per pixel. These large area, ULSI, active matrix liquid crystal displays are described in U.S. patent application Ser. Nos. 573,004, now abandoned, and 675,941, now abandoned, respectively filed on Jan. 23, 1984 and Dec. 3, 1984. The processes can also be used to produce ULSI circuits comprising non-linear threshold switch devices of the type described in U.S. patent application Ser. No. 603,852 now U.S. Pat. No. 4,667,189 issued May 1987 to Willem den Boer, J. Scott Payson, and Zvi Yaniv for *Programmable Semiconductor Switch For A Display Matrix Or The Like And Method Of Making The Device* and in U.S. patent application Ser. No. 679,770 filed Dec. 10, 1984 now U.S. Pat. No. 4,698,627 a continuation-in-part of said U.S. patent application Ser. No. 603,852. Similarly, ULSI circuits can contain n-pi-n and p-nu-p threshold devices using punch through technology described in U S. patent application Ser. No. 720,767 filed Apr. 8, 1985, now abandoned; and in the corresponding European Laid Open Patent Application 198346 of Subhendu Guha for *Solid State Threshold Devices* as well as two dimensional imaging devices of the type disclosed in U.S. patent application Ser. No. 713,928 filed Mar. 20, 1985 now U.S. Pat. No. 4,675,739 issued June 23, 1987 to Vincent Cannella, Clive Catchpole, John Keem, Louis Swartz, and Zvi Yaniv for *Integrated Radiation Sensing Array*. The disclosures of all of the aforementioned U.S. Patents and U.S. Patent Applications are specifically incorporated herein by reference.

As described by Meera Vijan, John McGill and Paul Day, above, the ULSI fabrication method comprises the steps of depositing one or more semiconductor layers on a substrate, forming a top contact metal mask over portion of a semiconductor layer, and thereafter removing the unwanted portions of semiconductor layers around a portion of semiconductor alloy material protected by the mask. The unwanted semiconductor alloy material is removed by an etching process in which a source of reactive ions etch away the unwanted portion of the semiconductor alloy material and the mask acts to prevent etching of those portions of the semiconductor layer which underlie the mask. As described by Vijan, et al. the etching is performed in a plasma reaction chamber in which ion bombardment is normal to the surface of the substrate. Consequently lateral etching of the semiconductor layers is eliminated and the resulting mesa structure possesses smooth sidewalls free of voids or overhangs. Moreover, the edges of the top metal contact mask are aligned with the walls of the underlying semiconductor layers. Vijan, et al. reports that the use of carbon tetrafluoride as the process gas during the etching, in the substantial absence of oxygen, provides particularly desirable results.

Following the processing of the mesa structure to repair ion damage and neutralize any contaminants on the sidewalls thereof, an insulative layer may be deposited over and around the mesa structure. This insulative layer preferably makes continuous contact with the mesa structure sidewalls, thus obviating possible voids. In a subsequent step, a via, preferably having sloped sidewalls, is formed through the insulative layer to the top metal contact mask. Thereafter, a layer of metallization is applied to the device using conventional masking and etching techniques. The remaining unetched metallization fills the via to make contact with the upper metal contact mask and forms an electrical lead which is connected to the top layer of the mesa structure. The bottom semiconductor layer of the mesa structure is connected to a bottom electrical contact lead which may be deposited on the substrate, e.g., before the mesa structure is formed.

The address lines in ULSI circuit are deposited by similar techniques. Typically, the x address lines, the y address lines, and the individual non-linear devices of the ultra large surface area ULSI's have a feature size of about 10 microns or less. As noted above, other large area, ULSI circuits as used in a display, sensor, or ROM, may have up to 40 million or more individual non-linear active devices incorporated therein. Testing of either all of the individual devices, or of at least all of the individual cells or elements containing a plurality of devices is necessary in order to avoid carrying improperly manufactured ULSI circuits through the complete manufacturing process, especially in the case of ULSI circuits having transparent conductive elements.

SUMMARY OF THE INVENTION

The inter-related problems of low yield, combined with expensive testing for defective cells are obviated by the method of this invention. According to the invention there is provided a method of testing a very large area, ULSI circuit, disclosed herein, having a plurality of individually addressable circuits early in the production process without expensive, time consuming, and labor intensive microprocessor driven testing. The method of the invention is an electrostatic method that immediately visually locates and identifies defective cells and address lines. The method comprises providing a chargeable powder in proximity to and below the integrated circuit with some means of agitation, i.e., to disperse the chargeable powder in order to allow it to be electrostatically attracted to the ULSI circuit. Agitation can be by flowing gas or by vibration. By a chargeable powder is meant a powder that will accept an electrostatic charge and adhere to a surface of opposite polarity. At least one of the individual devices of the ultra large scale integrated circuit is electrically selected. The selection and testing of the circuit is accomplished by applying electrical potential between the integrated circuit and the powder. The potential causes the powder particles to adhere substantially to only functional selected devices of the integrated circuit. At this point the circuit can be inspected for non-functioning devices, shorted or open transmission lines, and the like, and then the particles removed. The voltages used are typically in the range of device operation of the ULSI circuit, or lower, and generally less than 20 volts.

The ultra large area, ULSI multi-element integrated circuit may be an optoelectronic circuit as a display circuit where the individual addressable elements are picture elements, i.e., pixels. Alternatively, the ULSI circuit can be a sensor circuit where the individual addressable elements are sensor elements. Alternatively, the very large scale integrated circuit may be a memory as a random excess memory or a read only memory, and as a programmable read only memory.

The ULSI circuit has addressing means for individually addressing individual elements, e.g., row address lines and column address lines. The individual address lines generally have a feature size of less than about 100 microns.

The individual elements, as memory cells, picture elements, or sensor elements, each comprise at least one and may comprise 40 or more microelectronic devices as diodes, junction transistors, field effect transistors, threshold switches, memory switches, capacitors, inductors, and resistors.

The powder used to detect faults is a chargeable powder, and preferably a submicron powder, for example, carbon black. One satisfactory source of carbon black is electrophotographic toner. The concentration of powder in the electrophotographic toner and the total amount of electrophotographic toner is an amount sufficient to adhere to the functioning devices or elements thereof, and to address lines, but not adhere to the non-functional elements and address lines.

One source of the chargeable powder is electrophotographic toner. The concentration of chargeable powder in typical electrophotographic toners is at least about five weight percent, and generally from about five to 20 weight percent. Alternatively, carbon black alone may be utilized as the chargeable powder. The preferred carbon black has a mean particle size of less than about one micron, and an electrical resistivity of from about $10^4$ to $10^{11}$ ohm centimeters.

In carrying out the method of the invention, an electrical potential of up to about 20 volts, and generally from about 3 to about 10 volts is applied between the large area, ultra large scale integrated circuit and the powder.

The invention may be understood by reference to the drawings shown below.

THE DRAWINGS

DETAILED DESCRIPTION OF THE INVENTION

Figure 1:
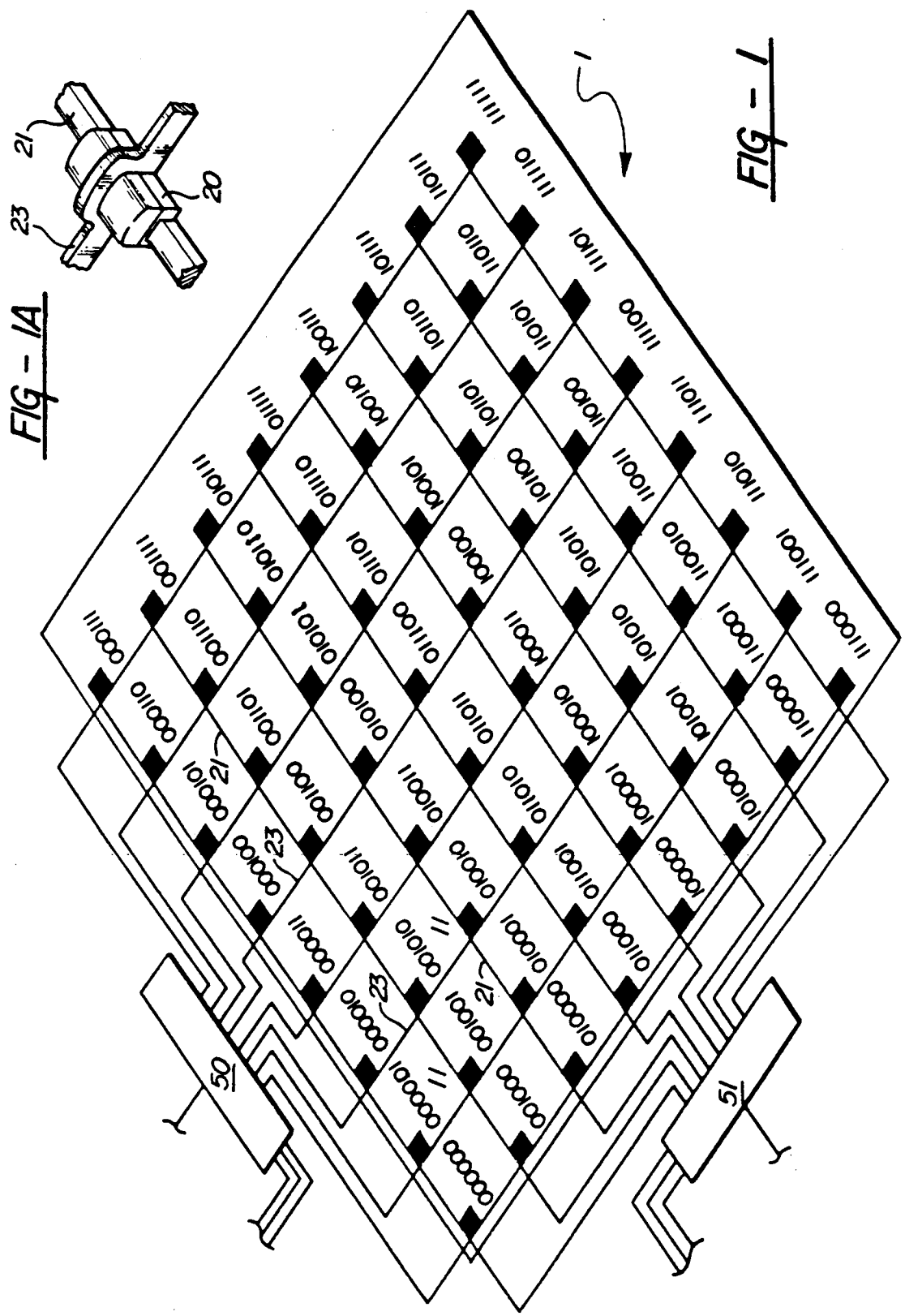
FIG. 1 is a perspective view of a generalized ULSI circuit with 64 individual general cells, and address lines, with the chargeable powder adherent to operational lines and elements.
Figure 2:
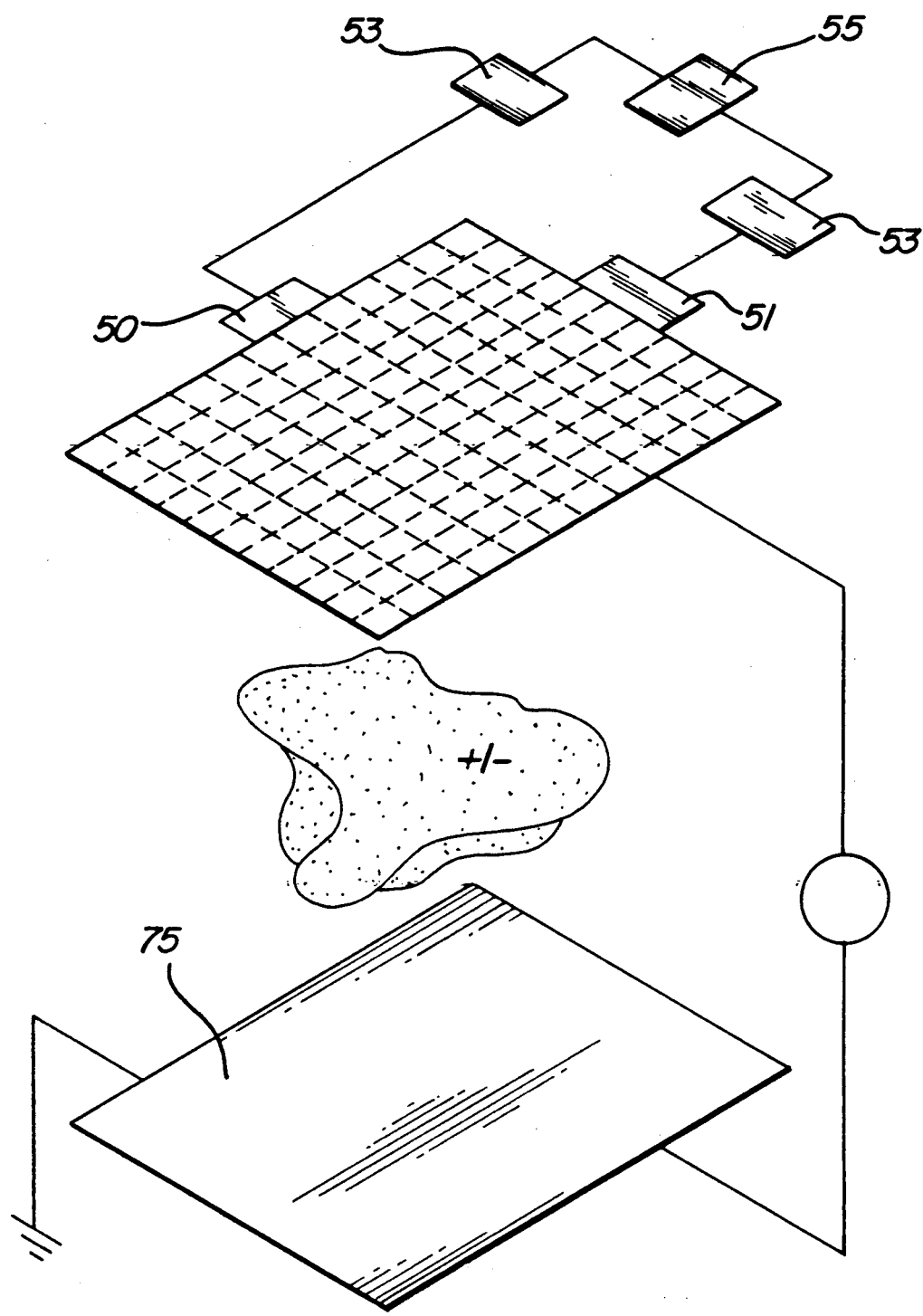
FIG. 2 shows a perspective view of a ULSI circuit with testing drive means to apply a field, a conductive powder in proximity thereto, and agitation means.

The method of our invention is generally shown by the sequence of FIGS. 1, and 2. These Figures show a ULSI circuit 1 after the deposition of the microelectronic devices 20 thereon and the address lines 21, 23 thereon, defining individual circuit elements thereof. To be noted are the individual cells, with binary addresses "000000" through "111111" addressed by addressing and driving circuits 50 and 51. The microelectronic devices, that is the individual circuit elements, as diodes, bipolar junction transistors, field effect transistors, capacitors, threshold switches, memory switches, and the like are indicated generally by 20 while the address lines are indicated by 21 and 23. These individual devices and address lines have feature sizes from about 1.0 micron to about 50 microns. The method of the invention inexpensively and quickly, in real time, detects manufacturing defects in both the microelectronic devices 20 and the address lines 21 and 23.

According to the invention described herein, there is provided a method of testing a large area integrated circuit 1 having a plurality of individually addressable elements 11 early in the production process, without expensive, time consuming, and labor intensive microprocessor driven testing. The method of the invention is an electrostatic method that immediately visually locates and identifies defective cells and address lines.

As illustrated in FIG. 2, the method comprises providing a dispersed or agitated powder 75, with the integrated circuit 1 in proximity to and above the powder 75. At least one device 20 of the ULSI circuit 1 is electrically selected. Testing of the ULSI circuit 1 is accomplished by applying an electrical potential, V, between selected address lines of the integrated circuit 1 and the conductive powder 75'. The potential causes individual conductive particles 75 to adhere to substantially only functional selected devices 20 and address lines 21 and 23 of the integrated circuit as shown with particularity in FIG. 1.

Figure 3:
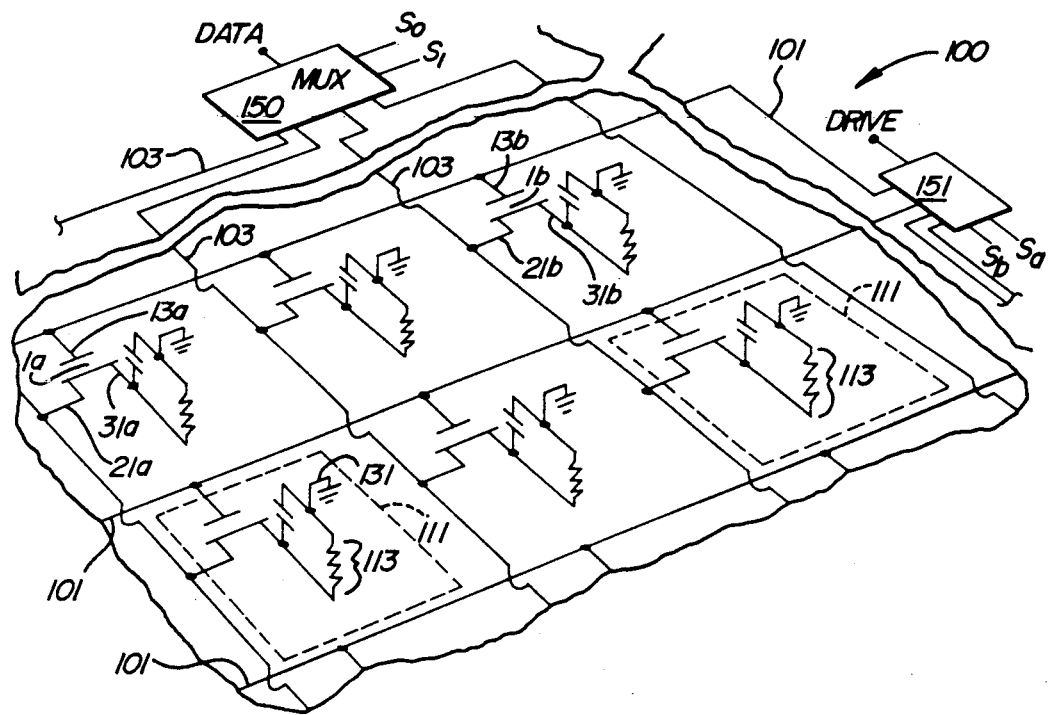
FIG. 3 is a ULSI circuit display.
Figure 4:
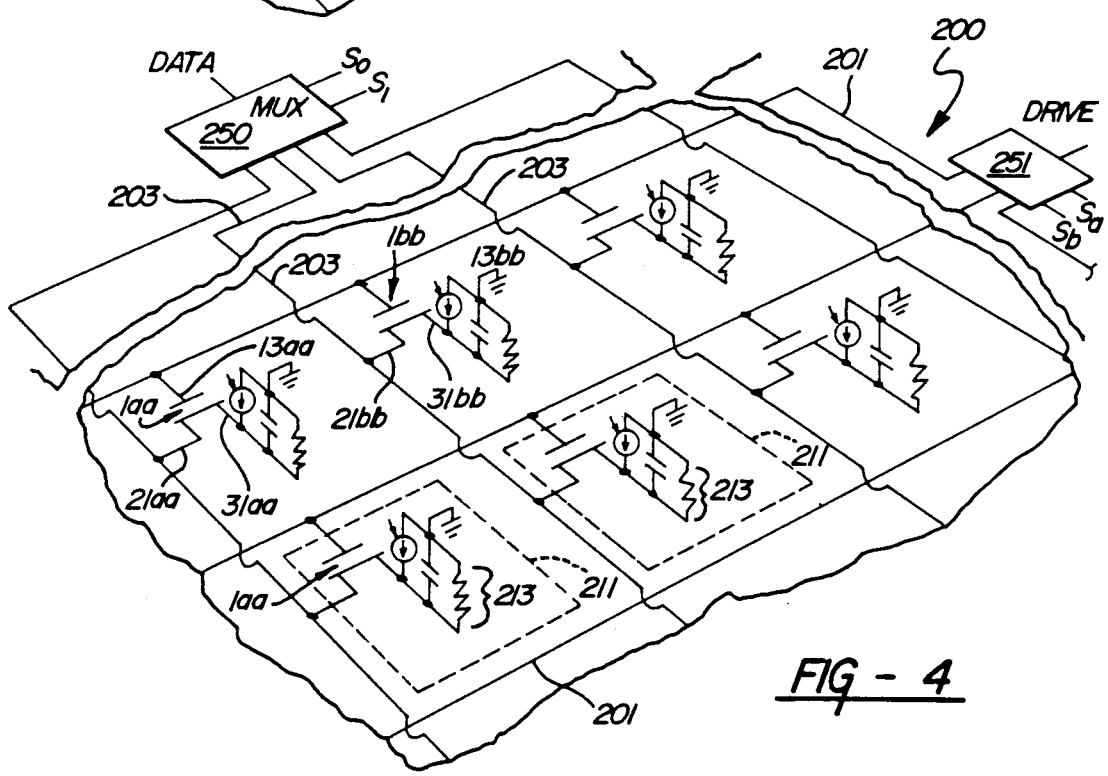
FIG. 4 shows a perspective view of an ultra large surface area, ultra large scale integrated circuit sensor.

As noted above, the method of the invention can be used with various kinds of large area integrated circuits. One such ULSI circuit is a display circuit, e.g., a light influencing display circuit 100, shown in FIG. 3, with individually addressable elements. Light influencing displays 100 are well-known in the art. Examples are liquid crystal displays, electro illuminescense displays, and electro chromic displays. The invention is applicable to all types of large area displays. The ULSI circuit displays 100 have plurality of individual addressable picture elements 111 called pixels. Each pixel 111 has a separate pair of opposing pixel electrodes, with light influencing material between them. Voltages are selectively applied to the electrode pairs. This causes the light influencing material between the electrodes to influence light, to emit, i.e., light, or to change optical density, or to change configuration, or to otherwise change polarization coefficient, extinction coefficient, or other optical parameters. These opposing pixel electrodes may be located on opposing substrates, such as opposing glass plates, with the light influencing material, such as liquid crystal material, located between the substrates. Alternatively, they may be on the same sheet of glass.

In relatively small arrays of pixels, such as those found in many digital watches, it is common to have all the pixel electrodes on one substrate connected in common and to have a separate address line for selectively applying voltages to each of the pixel electrodes on the second substrate. However, in large area arrays 100, such as large x-y arrays, it is impractical to have a separate address line connected to each pixel because too much room would be required by so many lines. Thus, in displays with many pixels 111 it is common to use x-y matrix addressing, e.g., with address lines 101 and 103 in which all the bottom pixel electrodes in a given row are connected to an address line 101 associated therewith, and all of the pixel electrodes of a given column are connected to an address line 103 associated with that column. This enables each pixel to be addressed by selecting its associated x and y address lines 101 and 103.

In relatively small x-y arrays each of the x and y lines are usually directly connected, without intervening electronic devices, to the top and bottom pixel electrodes in their associated rows or columns. Usually the pixels of such an array are driven sequentially in a scanning process in which each row is selected successively, and, during the selection of each row, each column is selected successively, causing each of the pixels of each row to be scanned in sequential order. During the time allotted for the selection of each pixel, the circuitry decides whether that pixel is to be turned on or off by controlling the amplitude of the voltage applied across the pixel.

In parallel scanned arrays each of the rows is selected in succession. During the selection of a row all of the column lines are driven in parallel with individually selected voltages, turning each pixel in the row to a desired state, either "on" or "off". Such multiplexing scanning schemes in which the pixels are driven directly by their x and y address lines without intervening non-linear electronic devices can work for relatively small arrays, and the method of this invention with these multiplexed arrays. However, as array size grows, the amount of time available for the application of a voltage to a given pixel or row of pixels decreases. As a result, the percentage of time during each scanning cycle that an individual pixel has a voltage applied across it decreases, thereby decreasing the average contrast between its "on" state and its "off" state. For this reason, large individually multiplexed displays tend to produce images with poor contrast, making such displays difficult to read.

One method of overcoming this limitation has been to use active display matrices instead of individually multiplexed matrices. In active display matrices, each of the pixels has associated therewith non-linear electronic devices which act as switches. The switch enables current to flow to or from the pixel during the brief period when the pixel is selected, enabling it to rapidly change state from "off" to "on" or vice versa. The switch also prevents current from flowing to the pixel when the pixel is not selected. By this expedient the charge placed on the pixel during its brief selection period is substantially maintained during the rest of the scanning cycle. As a result, the pixel tends to maintain its state, i.e., its "on" or its "off" state, during the entire scanning cycle, and not just when "selected", greatly increasing the contrast of the display.

One type of electronic device commonly used with pixels 111 of active display matrices 100 is the three terminal control device, i.e., a transistor such as a bipolar junction transistor or a field effect transistor. A three terminal control device is one that has two current path electrodes and a control electrode, i.e., emitter and collector current path electrodes, and a base control electrode in the case of bipolar junction transistor, and source and drain electrodes, and a gate control electrode in the case of field effect transistor. For example, in thin film field effect transistors, which are used in active matrix displays 100, the voltage applied to the gate electrode controls the amount of current which flows between the source electrode and the drain electrode, while in a bipolar junction transistor the base-emitter voltage controls the base current. The base current controls the emitter current and either saturates or controls the collector current.

The three terminal devices are usually arranged on one substrate of a display 100 with one of the current path electrodes connected to an electrode of the associated pixel. X and y lines 101 and 103 are on the substrate addressing each three terminal device and its associated pixel 111. One of the sets of address lines, for example, an x line 101 is connected to the control electrodes (base or gate electrode) of all of the three terminal devices in a row. Correspondingly, the other set of address lines, i.e., the y address lines 103, are connected to one of the current path electrodes of the control devices. For example, a y address line 103 is connected to a current path electrode of each pixel in its column. All of the pixel electrodes on the opposite substrate are typically connected to a common voltage, such as ground.

In operation, a given pixel is selected by applying voltage between the x line 101 connected to the control electrode of the three terminal device and the y line 103 connected to current path electrode of the three terminal device. For example, when the three terminal devices are thin film field effect transistors, the source electrodes of the transistor are connected to y lines 103 and the gates of the transistors are connected to x lines 101. A selected transistor is switched by applying the desired voltage between x line 101 connected to a current path and the y line 103 connected to the gate electrode.

Figure 5:
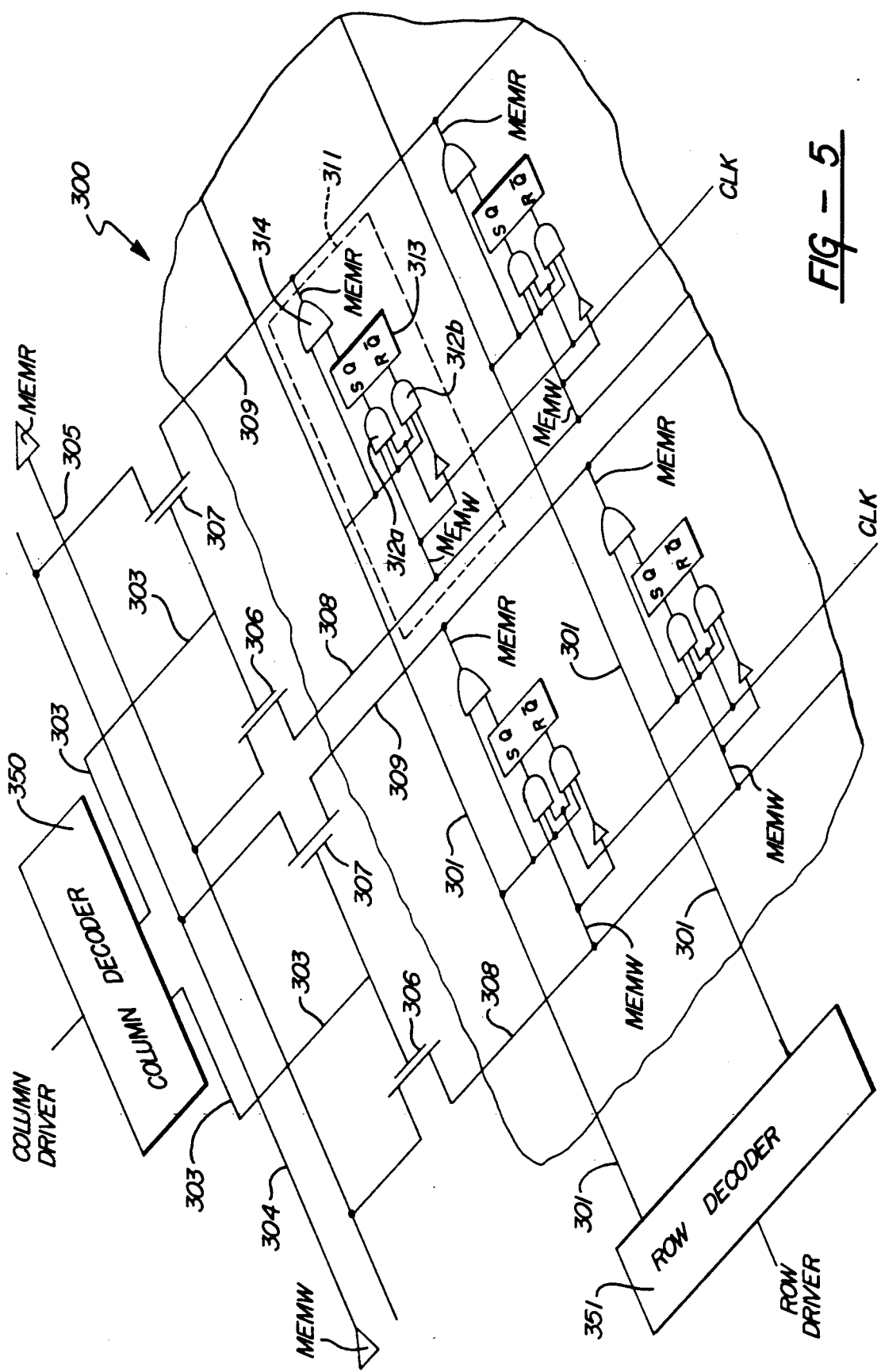
FIG. 5 shows a perspective view of an ultra large surface area, ultra large scale integrated memory device.

Alternatively, the ultra large area, multi device, Ultra Large Scale Integrated (ULSI) circuit may be a sensor circuit, as shown in FIG. 5. A sensor circuit 200 includes an array of photosensor pixels 211. Each photosensor pixel 211 is capable of providing a detectible output signal. The individual pixels 211 sense the amount of light incident thereon. The addressing and drive circuitry, e.g., address lines 201, and 203, and peripheral circuitry 150, 151 identify the amount of incident light to a location on the surface of the sensor 200. Sensor matrix arrays may be linear or two dimensional arrays. The array 200 shown in FIG. 5 is a two dimensional array.

Each photosensitive pixel includes a photogenerative element as a phototransistor, a photoresistor, or a photodiode for providing a detectible signal in response to the absorption of incident light. Each pixel also includes a blocking element for selectively blocking current flow through the selected or non-selection pixels.

Each pixel has a capacitance device which stores electric charge. This capacitance and the charge stored therein are what is read. Two types of photosensors are in use, and the method of the invention is useful with both of them. In one type of photosensor pixel, a predetermined amount of charge is stored across the pixel capacitance. The charge is discharged by a photo current produced by the light incident thereupon. The charge remaining on the pixel after a predetermined length of time has elapsed is a measure of the time integrated light intensity, i.e., the total amount of light sensed thereby.

In the alternative type of pixel, the photosensor element is a photovoltaic device. Exemplary is a p-i-n diode. A photovoltaic device may be operated forward biased in the fourth quadrant of its I-V (current-voltage) characteristic curve or reverse biased in the third quadrant of its J-V (current-voltage) characteristic curve. The photovoltaic effect is used to allow the pixel to generate charge in response to the light incident thereon. The total amount of charge generated is a measure of the time integrated incident light.

Either mode of photosensor may be utilized to generate a data stream. The data stream represents the illumination sensed by the pixels. In this manner, an array of pixels may be utilized to scan a pattern of information, such as alpha numeric information on a printed or written page, or a pattern on a surface of a work piece, or the like. Scanners are available in a multitude of embodiments, including arrays made using single crystal silicon or gallium arsenide technologies, thin film technologies, and hybrid technologies which combine thin film and single crystal devices.

Exemplary scanners made using thin film fabrication methods are described in U.S. Pat. No. 4,660,995 issued Apr. 2, 1987, to Vincent D. Cannella, Zvi Yaniv, and Robert R. Johnson for *Contact Type Document Scanner and Method* and in U.S. Pat. No. 4,675,739 issued June 23, 1987, to Clive Catchpole, Zvi Yaniv, Vincent D. Cannella, John Keem, and Louis Swartz for *Integrated Radiation Sensing Array*, the disclosures which are incorporated herein by reference.

Typically, the pixels are deployed in a two dimensional array. A two dimensional array of pixels may be utilized to scan an information bearing surface in contact therewith or projected thereon. In order to address an array of pixels, various multiplexed schemes are utilized. Alternative multiplexing schemes are described in U.S. patent application Ser. No. 885,897 filed July 15, 1986, now U.S. Pat. No. 4,728,803 issued Mar. 1, 1988 to Clive Catchpole, Jepson, Louis Swartz, and Olivier F. Prache for *Signal Processing Apparatus and Method for Photosensitive Imaging System*, the disclosure of which is specifically incorporated herein by reference.

The method of this invention is particularly applicable to very large area scanners, e.g., scanners having an area generally greater than about 8 inches by 10 inches. These scanners, typically fabricated by deposition techniques, have features, as address lines 201 and 203, and non-linear devices, that are formed by thin film deposition techniques with transparent features and/or small feature sizes.

In a typical array 200 each pixel 211 includes a blocking element, i.e., on isolation switch, for example, a diode, a transistor, or a threshold switch, disposed electrically in series with the photosensitive element. The blocking element assures that the only electrical signals that are read are those of the preselected or address pixels. When a photoresistor type pixel is illuminated, i.e., sensing information, the photosensitive element acts to dissipate the charge initially stored thereon. The voltage is periodically read, and is a measure of the time integrated illumination since the last reading. In arrays using photovoltaic elements, i.e., photodiodes operated in the fourth quadrant of the I–V characteristic curve, charge is cumulatively stored. In both cases the blocking element prevents leakage dissipation of the stored charge on the pixel. When the charge remaining or cumulatively stored in the pixel is to be read, the blocking element is rendered conductive, as, for example by forward biasing a diode, and the charge read.

Each pixel of the array may include a pair of blocking elements coupled together in series relationship at a common node, and in electrical communication with at least one of the address lines associated with the pixel. The pixel further includes a photosensitive element in electrical communication with the common node and with at least one other of the address lines of the pixel. As shown in FIG. 5, the pixels may be arrayed in a two dimensional array. Alternatively, the image sensor may be a linear image scanner, i.e., a linear scanner.

Alternatively, the ultra large surface area, ultra large scale multi device integrated circuit may be a memory as a RAM, shown with particularity in FIG. 6. The RAM there shown includes a plurality of individual memory cells 311. Each memory cell includes a memory write line 3.5, a memory read line 309, a data line, two and gates for supplying data to a flip flop, and a flip flop.

The address lines, interconnects, leads, bus bars, and non-linear electronic devices can have feature sizes of less than about 100 microns, typically less than 1.0 micron, e.g., from about 0.05 micron to about 50 micron.

It is particularly critical to economical manufacturing of these ULSI circuits that defective circuits be identified as early as possible in the manufacturing process in order to avoid carrying out further expensive, time consuming, manufacturing steps on circuits which are incapable of being utilized as fully operative, functional circuits. Thus, early identification of defective integrated circuits and of systematic manufacturing errors is essential to the economical manufacture and sale of ULSI circuits.

In this regard it has been found that if an ULSI circuit is maintained in proximity to a source of finely powdered chargeable particulate material, it becomes possible to cause the finely powdered material to adhere to substantially only functional circuit elements, pixels, and devices and to fail to adhere to inoperative segments thereof. This allows a quick visual examination of the ULSI circuit to quickly identify defective circuits. Key variables are the size of the chargeable particulate material, the electrical parameters thereof as the dielectric constant or the electrical conductivity thereof, the field applied between the powder and ultra large scale integrated circuit, and the agitation.

One desirable particulate chargeable material is carbon black. When carbon black is used as the chargeable particulate material, one preferred carbon black is approximately 1 micron in size, and generally from 0.8 micron to about 10 microns in size. Carbon black of this size is commercially available as a component of electrophotographic toner materials. More particularly, electrophotographic toner materials, including both the carbon black, as described hereinabove, and 1 micron to 10 micron thermoplastic polymer particles may be utilized, with both the polymer and the carbon black adhering to functional circuit elements and address lines.

We have obtained satisfactory results with commercially available electrophotographic toners containing at least about 5 weight percent carbon black and generally from about .5 to about 20 weight percent carbon black. Electrophotographic toners containing higher or lower amounts of carbon black may also be useful in the method of this invention. The preferred carbon black is carbon black having an electrical resistivity from about $10^{-4}$ to about $10^{-11}$ (ohm-centimeter).

The potential applied is generally from about 2 to about 20 volts with the device being from about 1 to about 10 centimeters from a bed of chargeable particulate. The chargeable particulate is agitated, e.g., by a flowing and/or circulating gas stream, or by ultrasonic vibration.

While the invention has been described with respect to certain preferred exemplifications and embodiments thereof, it is not intended to limit the scope of the invention thereby but solely by the claims appended hereto.

We claim:

1. A method of testing a large area active matrix liquid crystal display; said method including the steps of:
    (a) providing a matrix array which includes a plurality of rows and columns of address lines; each pair of adjacent row address lines and column address lines defining a picture element; each picture element including switching means for discretely electrically interrogating said element; said switching means including a plurality of thin film layers of silicon alloy material;
    (b) providing a chargeable dry powder;
    (c) providing the matrix array of picture elements, including the layers of silicon alloy material of the switching means, in proximity to the chargeable powder;
    (d) electrically activating the switching means of the matrix array; and
    (e) applying an electrical potential between the switching means and the powder, said potential causing particles of the chargeable powder to adhere to the activated picture elements of the matrix array.

2. The method of claim 1 wherein the switching means each comprise at least one non-linear microelectronic device.

3. The method of claim 1, wherein the chargeable powder comprises an effective amount of carbon black.

4. The method of claim 1 comprising applying an electrical potential of at least about 2 volts between the large area matrix array and the chargeable powder.

5. The method of claim 2 wherein the non-linear microelectronic device is selected from the group consisting essentially of field effect transistors, bipolar junction transistors, capacitors, threshold devices, diodes, and combinations thereof.

* * * * *